United States Patent
Casati et al.

(10) Patent No.: US 7,459,771 B2
(45) Date of Patent: Dec. 2, 2008

(54) ASSEMBLY STRUCTURE FOR ELECTRONIC POWER INTEGRATED CIRCUIT FORMED ON A SEMICONDUCTOR DIE AND CORRESPONDING MANUFACTURING PROCESS

(75) Inventors: Paolo Casati, Sesto S. Giovanni (IT); Amedeo Maierna, Albuzzano (IT); Bruno Murari, Monza (IT)

(73) Assignee: STMicroelectronics, S.R.L., Agrate Brianza (IT)

( * ) Notice: Subject to any disclaimer, the term of this patent is extended or adjusted under 35 U.S.C. 154(b) by 0 days.

(21) Appl. No.: 10/369,114

(22) Filed: Feb. 18, 2003

(65) Prior Publication Data

US 2003/0209783 A1 Nov. 13, 2003

(30) Foreign Application Priority Data

Feb. 18, 2002 (EP) .................................. 02425079

(51) Int. Cl.
*H01L 23/495* (2006.01)
(52) U.S. Cl. ...................... 257/676; 257/675; 257/672
(58) Field of Classification Search .................. 257/659, 257/660, 666–677, 734–738, 778–786
See application file for complete search history.

(56) References Cited

U.S. PATENT DOCUMENTS

| | | | |
|---|---|---|---|
| 4,300,153 A * | 11/1981 | Hayakawa et al. ........... | 257/668 |
| 4,809,135 A * | 2/1989 | Yerman ....................... | 361/772 |
| 5,235,207 A | 8/1993 | Ohi et al. | |
| 5,293,301 A * | 3/1994 | Tanaka et al. ............... | 361/707 |
| 5,683,943 A * | 11/1997 | Yamada ....................... | 29/827 |
| 5,696,032 A | 12/1997 | Phelps, Jr. et al. | |
| 6,129,993 A * | 10/2000 | Kumamoto et al. .......... | 428/614 |
| 6,130,477 A * | 10/2000 | Chen et al. .................. | 257/712 |
| 6,198,171 B1 * | 3/2001 | Huang et al. ................ | 257/787 |
| 6,201,186 B1 | 3/2001 | Daniels et al. | |
| 6,402,009 B1 * | 6/2002 | Ishikawa ..................... | 228/6.2 |
| 6,437,447 B1 * | 8/2002 | Huang et al. ................ | 257/777 |
| 6,448,632 B1 * | 9/2002 | Takiar et al. ................ | 257/659 |
| 6,507,120 B2 * | 1/2003 | Lo et al. ..................... | 257/778 |
| 6,513,701 B2 * | 2/2003 | Mead et al. ............. | 228/248.1 |
| 6,559,388 B1 * | 5/2003 | Kresge et al. ............... | 174/252 |
| 6,559,525 B2 * | 5/2003 | Huang ......................... | 257/675 |
| 6,597,059 B1 * | 7/2003 | McCann et al. ............. | 257/673 |
| 6,661,087 B2 * | 12/2003 | Wu ............................. | 257/692 |
| 6,734,556 B2 * | 5/2004 | Shibata ....................... | 257/737 |
| 2002/0121680 A1 * | 9/2002 | Ahn et al. ................... | 257/666 |

OTHER PUBLICATIONS

Harper, Electronic Packaging and Interconnection Handbook, 1991, McGraw-Hill, pp. 1.9-10 and 1.59.*
Morris, Dictionary of Science and Technology, 1992, Academic Press, p. 289.*
European Search Report for EP 02 42 5079 dated Jul. 2, 2002.

* cited by examiner

*Primary Examiner*—Leonardo Andújar
(74) *Attorney, Agent, or Firm*—Lisa K. Jorgenson; Bryan A. Santarelli; Graybeal Jackson LLP

(57) ABSTRACT

An assembly structure for an electronic integrated power circuit, which circuit is fabricated on a semiconductor die having a plurality of contact pads associated with said integrated circuit and connected electrically to respective leads of said structure, wherein a shield element is coupled thermally to said die by a layer of an adhesive material.

4 Claims, 3 Drawing Sheets

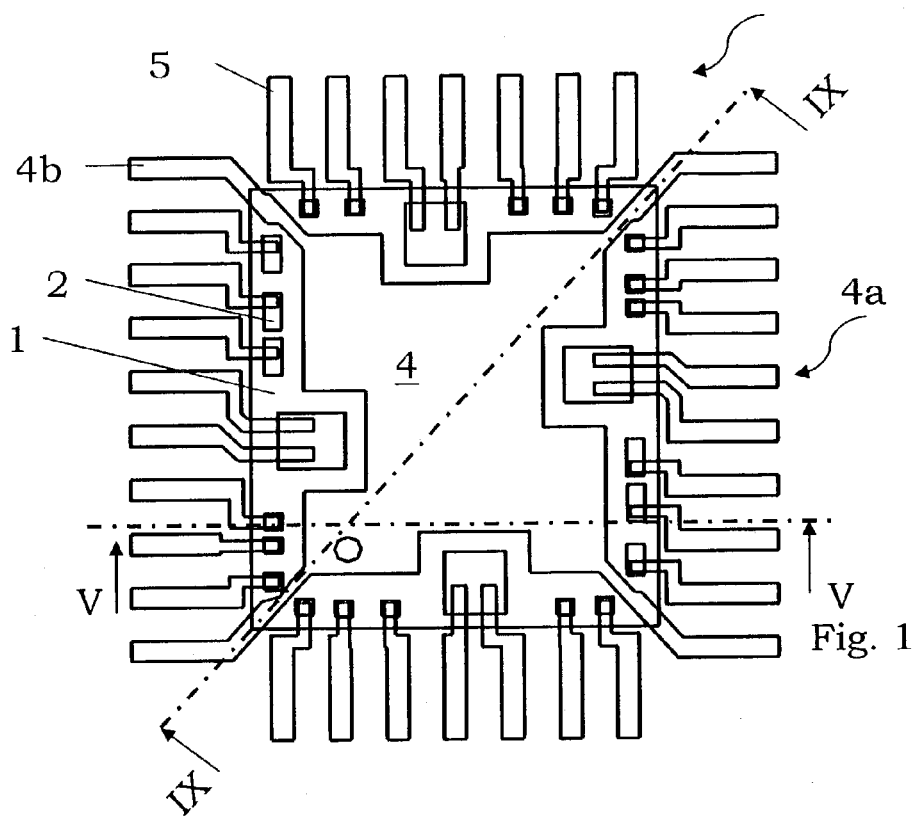
Fig. 1
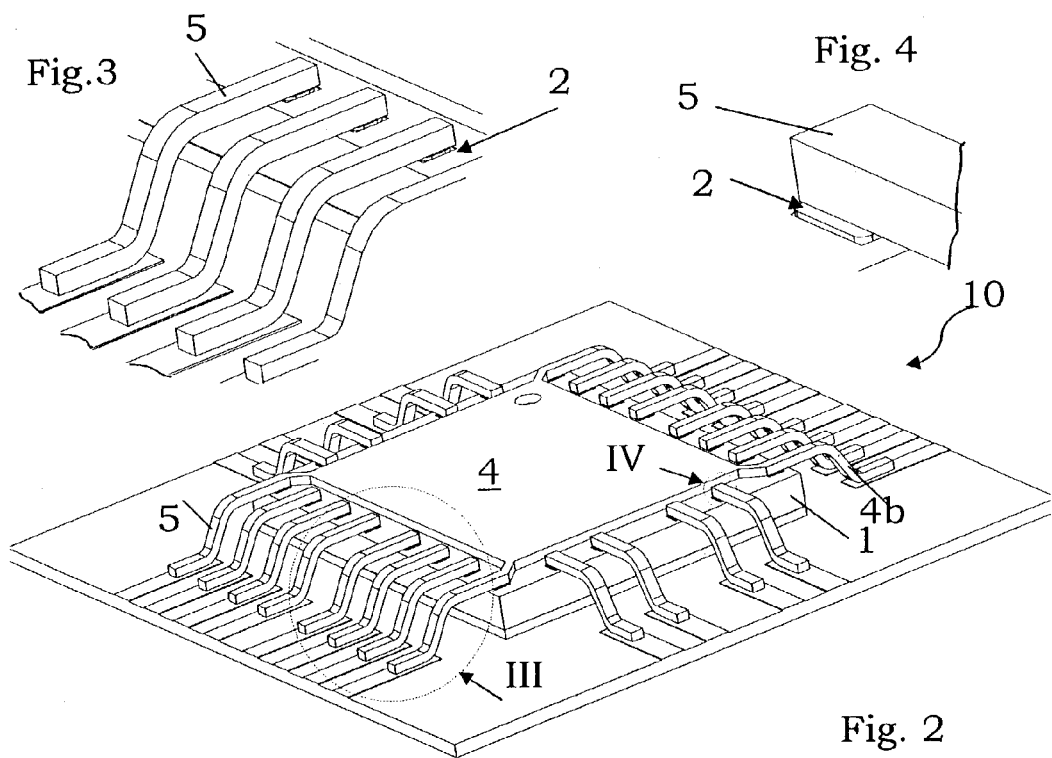
Fig. 3
Fig. 4
Fig. 2

ASSEMBLY STRUCTURE FOR ELECTRONIC POWER INTEGRATED CIRCUIT FORMED ON A SEMICONDUCTOR DIE AND CORRESPONDING MANUFACTURING PROCESS

PRIORITY CLAIM

This application claims priority from European patent application No. 02425079.7, filed Feb. 18, 2002, which is incorporated herein by reference.

TECHNICAL FIELD

The present invention relates generally to an assembly structure for an electronic integrated power circuit formed on a semiconductor die and the corresponding manufacturing process.

Specifically, an embodiment of the invention relates to an assembly structure for an electronic integrated power circuit formed on a semiconductor die comprising a plurality of contact pads associated with said integrated circuit and connected electrically to respective leads of said structure.

Another embodiment of the invention further relates to a process for manufacturing an assembly structure for an electronic integrated power circuit formed on a semiconductor die having a plurality of leads, the process comprising the following step:

forming a plurality of contact pads in a peripheral area of an active face of said die.

Yet another embodiment of the invention relates, particularly but not exclusively, to an assembly structure for an integrated power circuit for use in SMT (Surface-Mount Technology) applications, this specification covering this field of application for convenience of illustration only.

BACKGROUND

As is well known, semiconductor electronic devices, e.g. power devices, comprise a small plate of a semiconductor material, known as the "die" or "chip", which has a surface area of a few square millimeters on which an electronic circuit is monolithically integrated. This die has a plurality of terminals, typically as contact pads (typically formed from metal), which are provided on its surface and which are electrically connected during the manufacturing process to an outer frame, the latter being also made of metal and part of the electronic device.

The electrical connection of the die of semiconductor material to the frame can be achieved by different technologies, including one that provides wire connections and is commonly referred to as the "wire bonding" technique. More particularly, with this technique, one end of each connecting wire is bonded to a contact pad that has been formed on the die of semiconductor material, and the other end is bonded to a corresponding lead formed on the frame to which the die is to be connected.

Electronic power devices are widely used in all branches of electronics. Particularly in the automobile industry, vehicles are equipped with electronic control units containing electronic power devices for controlling the operation of vehicle components. Such control units are becoming more and more compact in size and provide an increasing number of functions. This results in increased power density and consequently an increase in the heat generated from the integrated circuits. More particularly, it has been found that in such cases, wire bonding is inadequate to handle high current densities, referred to as high power hereinafter. The size of the leads employed is on the order of 35 μm, and the lead contacts are not sufficiently reliable to handle currents in excess of a few Amperes.

There is, therefore, a demand for semiconductor electronic devices, especially power devices, which can be operated under extreme conditions, e.g., in environments where wide temperature fluctuations up to 180° C. are expected.

Another demand that comes from the automotive industry, as well as from electronic applications (e.g., printers, interfaces, mobile phones), is for electronic devices that are substantially unaffected by electromagnetic radiation without cumbersome shielding arrangements.

SUMMARY

An embodiment of this invention provides an assembly structure for an integrated electronic power circuit designed for high-power applications, which has appropriate structural and functional features that assure a good immunity to electromagnetic radiation and adapted to better dissipate heat, thereby overcoming the drawbacks of prior-art devices.

Another embodiment of the invention provides a process for manufacturing assembly structures for integrated power circuits, whereby the problems of connecting the chip terminals to the chip mounted on a board and to the external circuit are solved, thus avoiding the prior-art constraints from the use of wire-bonding equipment and low-current-capacity wires.

Another embodiment of this invention is one of fitting an integrated power circuit within a metal mount (frame) incorporating a shield element that operates as a shield from electromagnetic radiation and at the same time functions as a heat sink.

More specifically, this embodiment of the invention is an assembly structure for an integrated power circuit, wherein a shield element and all the contact leads are formed from a single metal sheet, and the semiconductor crystal is attached to the metal structure (frame) before the leads are welded to the die and then trimmed and formed to a typical gull-wing shape.

Yet another embodiment of the invention further relates to a process for manufacturing such an assembly structure for an integrated power circuit.

More specifically, in this embodiment of the invention, the leads are connected to the die by a TAB (Tape Automated Bonding) process.

BRIEF DESCRIPTION OF THE DRAWINGS

The features and advantages of the structure and the process according to the invention will become apparent from the following description of embodiments thereof, given by way of non-limiting examples with reference to the accompanying drawings.

In the drawings:

FIG. 1 is a top plan view of an assembly structure according to an embodiment of the invention.

FIG. 2 is an isometric view of the assembly structure shown in FIG. 1 according to an embodiment of the invention.

FIG. 3 is a first, enlarged detail view of the assembly structure shown in FIG. 2 according to an embodiment of the invention.

FIG. 4 is a second, enlarged detail view of the assembly structure shown in FIG. 2 according to an embodiment of the invention.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Referring to FIGS. 1 to 4, there is shown an assembly structure 10 for an integrated electronic power circuit fabricated on a semiconductor plate 1, the semiconductor plate (die) 1 being coupled thermally to a shield element or die blocking pad 4. The semiconductor plate 1 is coupled electrically to a plurality of pins (leads) 5 via a respective plurality of bond pads (bumped pads) 2.

Figure 5:
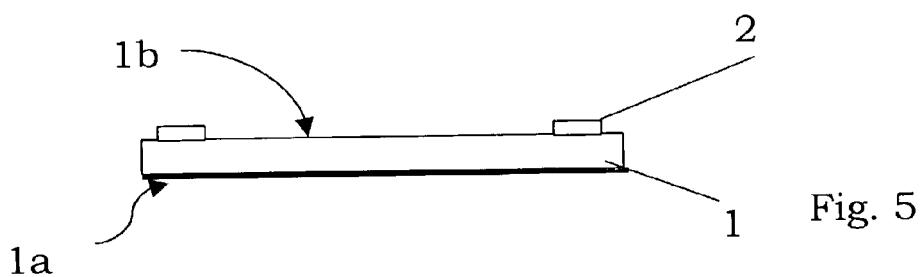
FIGS. 5 to 8 are sectional views, taken along line V-V of the assembly structure shown in FIG. 1, at different steps of the manufacture of this assembly structure according to an embodiment of the invention.

Referring to FIG. 5, the die 1 is obtained from silicon wafers having a conventionally provided bottom metal layer 1a. The metal layer 1a may be, for example, a chromium/nickel/gold alloy. This metal layer 1a may also be a thick metallization layer, up to 100-micron thick, of copper or another suitable metal to establish a secure weld to the leads and at the same time provide good heat conduction.

Referring to FIGS. 1 and 2, the die blocking pad 4 is a metal sheet and substantially square in shape, with suitable extensions 4b formed at its corners. The extensions 4b of the die blocking pad 4 can be connected to a ground lead outside the structure 10. In this way, the die blocking pad 4 effectively provides good electromagnetic shielding for the integrated components in the die 1.

Figure 6:
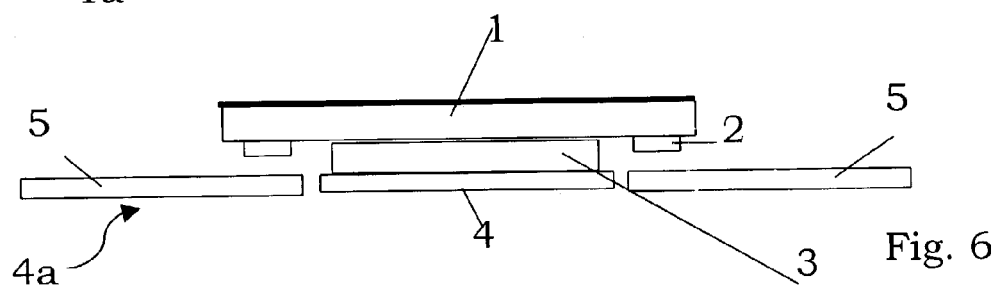
Figure 7:
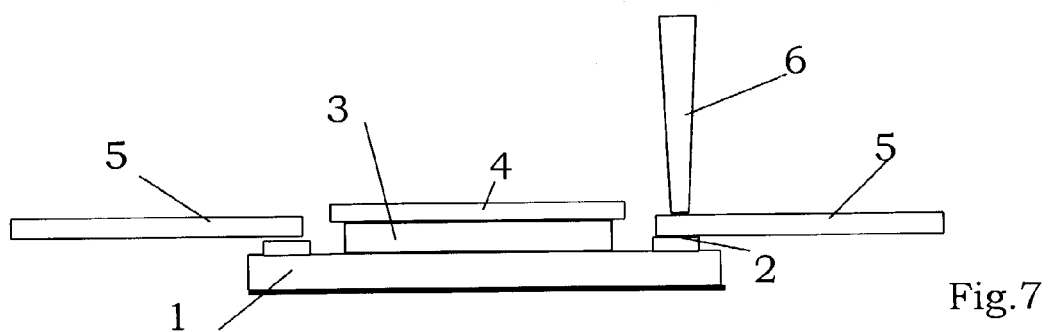
Figure 8:
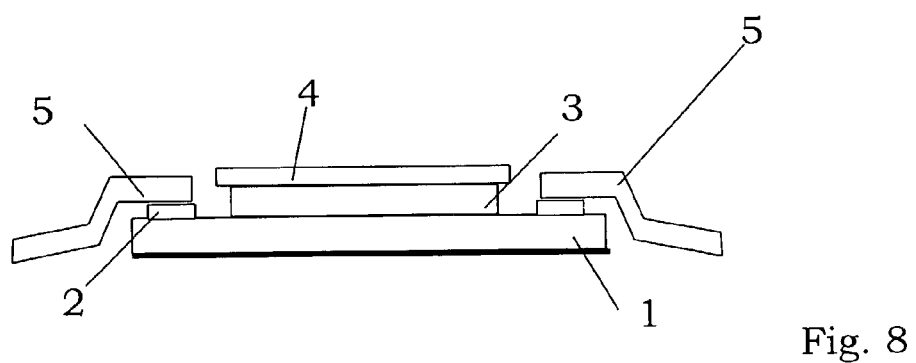
Figure 9:
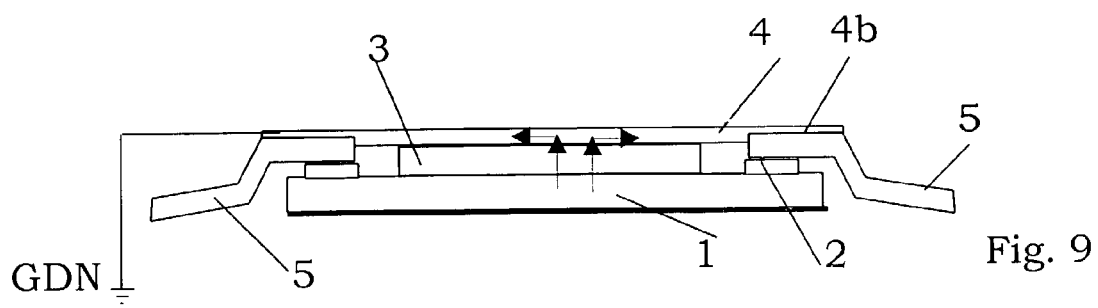
FIG. 9 is a sectional view, taken along line IX-IX, of the assembly structure shown in FIG. 1 according to an embodiment of the invention.

Referring to FIG. 6, the die blocking pad 4 is also effective to reduce thermal resistance and dissipate heat from power generation for a short time (100 ms to 1 second). This heat-dissipating action is made possible by the die 1 being attached to the die blocking pad 4 through a layer 3 of an adhesive material. This adhesive layer 3 may be either a thermoplastic material or a thermosetting material which is a good heat conductor effective to dissipate heat from the die 1. This material may also be a polyimide adhesive layer. The die blocking pad 4 thus doubles as an electromagnetic shield and a heat sink.

Referring again to FIG. 5, when power is generated for a longer time, heat is dissipated from the assembly structure 10 conventionally: the heat is transferred through the die 1 into the underlying substrate, i.e. heat is dissipated through the die bottom and the metal layer 1a.

Figure 11:
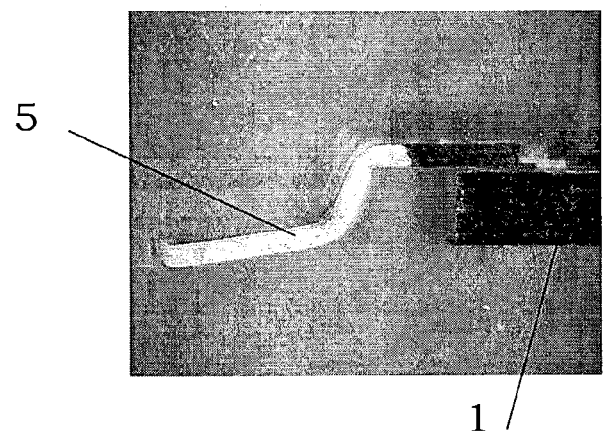
FIG. 11 is a photograph of a lead of the structure in FIG. 1 according to an embodiment of the invention.

Referring to FIG. 11, a final molding operation gives the lead 5 its typical gull-wing shape.

A process for manufacturing the assembly structure 10 of FIG. 2 for an integrated electronic power circuit, will now be described according to an embodiment of the invention.

Referring again to FIG. 5, a number of contact pads (bumps) 2 are formed on the peripheral end of the die 1. These pads are formed, in particular, on an active face 1b of the die 1. The active face 1b is that portion of the die 1 where the electronic circuits are integrated. These contact pads 2 are obtained, for instance, by electrolytically depositing pure gold onto a thin titanium/tungsten (TiVV) barrier. Alternatively, these contact pads 2 may be obtained by deposition of a nickel/gold alloy in a non-electrolytic process. Advantageously, these contact pads 2 are formed at a uniform thickness of about 20 to 25 microns, and are planar to the surface of the die 1.

Referring to FIG. 6, the die blocking pad 4 is formed within a conductive frame (leadframe) 4a made of thin sheet copper or another suitable metal, and is suitably patterned to meet circuit requirements. In particular, the frame 4a is cut out (by shearing or etching) to form a plurality of narrow strips representing electric connectors or leads 5 with a substantially sunburst pattern radiating from the centrally located die blocking pad 4.

Advantageously, a plurality of assembly structures can be formed from the same frame.

Still referring to FIG. 6, in a preferred embodiment, the leads 5 are copper, 130 to 150-microns wide and about 100-micron thick, and adapted to handle the currents generated by the integrated power circuits that are fabricated on the die 1. A layer 3 of an adhesive material is deposited, or laminated, onto the die blocking pad 4. This adhesive layer 3 may be a polyimide adhesive layer or could be dispensed onto the die blocking pad or shield element.

The adhesive layer 3 may be provided on the die 1 instead. Advantageously, the thickness of the adhesive layer 3 is within the range of 25 to 100 microns.

Referring again to FIG. 5, according to one embodiment of the invention, the active face 1b of the die 1, carrying the contact pads 2, is arranged to face the leads 5 in alignment thereto. The die 1 is then pressed onto the adhesive layer 3 and brought to setting process temperature. Advantageously, the die 1 is pressed onto the die blocking pad 4 through the thermofixing adhesive layer 3, with the setting temperature of about 260° C., for about one second under a pressure of 14 Newtons, with a 4×5 mm die, to bond the die 1 and die blocking pad 4 adhesively together.

Referring again to FIGS. 1 and 2, this mutual bond of the die 1 and the die blocking pad 4, as provided in the process for manufacturing the assembly structure according to an embodiment of this invention, allows the die of semiconductor material to be positioned with good accuracy. The bond of the die of semiconductor material to the die blocking pad 4 has shown upon testing to have a good capacity to resist delamination, or in other words, that a considerably large force typically must be applied in order to separate the die 1 from the die blocking pad 4. With the resulting structure 10 turned over 180°, the electric connection of the contact pads 2 to the leads 5 is then made.

Figure 10:
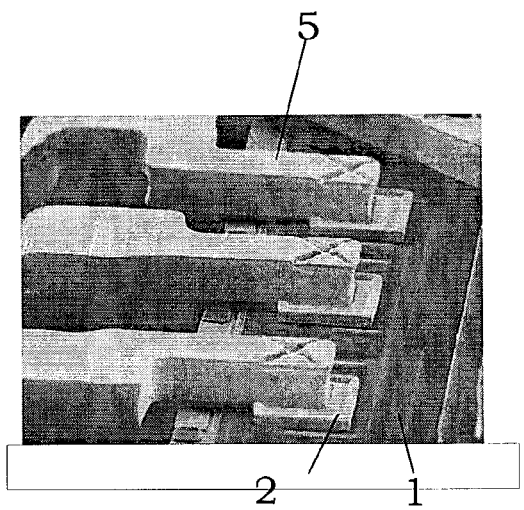
FIG. 10 is an electron-microscope (SEM) image showing the detail of FIG. 4 according to an embodiment of the invention.
Figure 12:
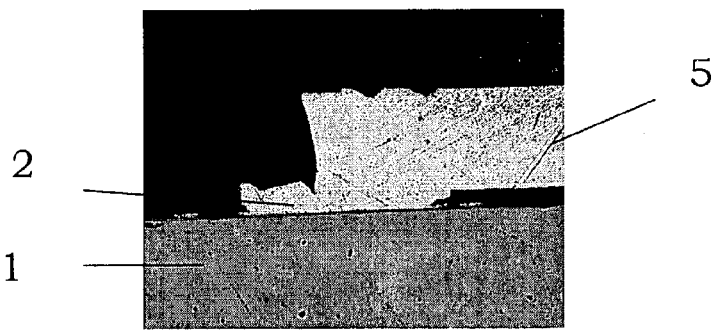
FIG. 12 is an electron-microscope (SEM) image showing the detail of FIG. 4 in side view according to an embodiment of the invention.

Referring to FIGS. 10 to 12, this connecting operation is realized by a thermo-sonic welding process. In this way, the leads 5 are welded on the contact pads 2. In the preferred embodiment, the copper leads 5 are 130 to 150 microns wide and about 100 microns thick. Tests performed have demonstrated the large force typically required to separate the leads 5 and the die 1 of semiconductor material, i.e. that a considerably large force typically must be applied to break the bond between the leads 5 and the die 1, in particular, a force of up to 400 grams may have to be applied where a 130-micron lead 5 is involved. Measurements made of the voids at the interface between the leads 5 and the contact pads 2 also gave excellent results.

In another embodiment, the electrical connecting operation could be a reflow or eutectic welding process using, for instance, a gold/tin alloy in eutectic diagram proportions, such as 80/20 Sn/Au.

Referring to FIGS. 6-9, at this stage of the process, the structures formed within the frame 4a are trimmed and formed. In particular according to one embodiment of the invention, the formed structures are placed on a mold having as many hollows as there are structures in the frame 4a. A punch 6 is lowered onto the leads 5 to hold them mechanically and cut them to size; it also starts forming them into the typical gull-wing shape of surface-mounted components. Advantageously, the step of trimming and forming the leads 5 is a one-shot process according to an embodiment of the invention.

The resulting structures are conventionally placed into a final package.

Referring again to FIGS. 5 and 6, as said before, in a process according to an embodiment of the invention, the die 1 is adhered with its active face 1b to the die blocking pad or shielding layer 4, and the contact pads 2 are then welded to the leads 5, this procedure makes aligning the die 1 to the leads 5 a less critical operation. Advantageously, the structure 10 of an embodiment of this invention employs leads 5 with a thickness of 100 μm, so that they can handle the currents used in automotive applications. Still referring to FIG. 6, the manufacturing process of an embodiment of this invention uses a TAB (Tape Automatic Bonding) welding processes in which the die 1 is connected electrically to an external circuit by connecting the contact pads 2 to the leads 5 directly. In particular, the frame 4a where the leads 5 are formed includes a polyimide dielectric layer or an insulative layer of another suitable material, onto which a layer of a metal, e.g. copper, is laminated. Polyimide layers are made of a thermoplastic material that retains its insulative property even at a high temperature. Accordingly, this technique is advantageous in automobile applications because of the excellent performance in unusually high temperatures. The frame 4a is then photocut into and wrought conventionally to produce the leads and die blocking pads or shield elements 4 as described above. The formed leads 5 are bonded to the die 1 as previously described.

Referring again to FIG. 2, in another embodiment, the die blocking pad 4 may be split (not shown) topologically into several copper zones electrically isolated from one another. By providing such zones, the weld pads can be contacted on the opposite side of the die 1 also, and the die blocking pad 4 can, in this way, be used to make the electric contacts, and to provide an electromagnetic shielding function. In particular, the die blocking pad 4 is suitably wrought in such applications to form suitable tracks on its inside for electrical connection purposes.

Still referring to FIG. 2, the process for manufacturing the structure 10 according to an embodiment of the invention is summarized in the following steps:

1. preparing contact pads, i.e. contacts, on the semiconductor plate 1, in a peripheral area of an active face of plate 1, by a metallizing process using gold or another metal that responds well to bonding;
2. affixing the semiconductor plate 1 to a mounting frame/circuit, e.g. by an adhesive process using insulative matrix glues or thermoplastic tapes;
3. electro-mechanically connecting the ends of the leads 5 by a point-to-point thermo-sonic or eutectic bonding (e.g. 80/20 Sn/Au) process;
4. trimming and forming the outer zone of the leads by a cold process using a set of suitably prepared molds and punches.

In conclusion, the assembly structure 10 for an integrated power circuit, including a shield element according to an embodiment of the invention, can provide the following advantages:

1. a capability to handle large currents of up to 8-10 Ampères, from the use of much thicker leads than with conventional techniques;
2. a high capability for heat dissipation and a low thermal resistance between the semiconductor junction and the substrate, Rth (j-sub), especially when operated at widely varying temperatures, in the −40° to +125° C. range, that automobile applications involve; in particular, this allows the structure 10 to be mounted on electronic boards or hybrid circuits of automobile vehicles by a fully automated process;
3. suitability to STM (Surface Mount Technology) mounting thanks to the gullwing shape of the leads, which makes the structure a suitable one for use in a fully automated pick-and-place system;
4. the process and structures are entirely lead-free;
5. a heat-sink element that is integrated to the structure by adhering the die of semiconductor material onto a die blocking pad or shield element 4 with a thermoplastic layer between; the integrated circuit in the die can also dissipate heat through the die blocking pad 4, especially for short-term pulses (periods of 10 to 1000 milliseconds), so that a reduction in the junction-to-substrate thermal resistance, Rth (j-sub), is later achieved; this metal die blocking pad 4 will also shield the integrated circuit against electromagnetic interference, when connected to a suitable static electric potential.

In conclusion, the assembly structure 10 according to an embodiment of this invention has reduced space requirements and is comparable in size to those of class CSP (Chip Scale Package) components, with no wire connections (wire bonding), while the input/output leads of the integrated power circuit can sustain large currents.

What is claimed is:

1. An integrated circuit, comprising:
   a semiconductor die having a first side and a contact pad disposed on the first side;
   a lead welded to and in electrical connection with the contact pad and having a welded portion spaced a first distance from the first side of the die, wherein the welded portion of the lead is unencapsulated; and
   an electromagnetic shield not overlapping the contact pad and thermally coupled to the first side of the semiconductor die by an adhesive layer with no electrical interconnects to the shield and the die through the adhesive layer and spaced a second distance from the first side of the die, the second distance greater than or equal to the first distance.

2. An integrated circuit, comprising:
   a semiconductor die having a first side and a contact pad disposed on the first side;
   a lead welded to and in electrical connection with the contact pad and having a welded portion spaced a first distance from the first side of the die, wherein the lead comprises first, second and third sections, the first and second sections having an obtuse inner angle, and the second and third sections having an obtuse inner; and
   an electromagnetic shield not overlapping the contact pad and thermally coupled to the first side of the semiconductor die by an adhesive layer with no electrical interconnects to the shield and the die through the adhesive layer and spaced a second distance from the first side of the die, the second distance greater than or equal to the first distance.

3. The integrated circuit of claim 2 wherein the first and third sections are substantially parallel.

4. The integrated circuit of claim 2 wherein the first and third sections are not parallel.

* * * * *

UNITED STATES PATENT AND TRADEMARK OFFICE
CERTIFICATE OF CORRECTION

PATENT NO.          : 7,459,771 B2
APPLICATION NO. : 10/369114
DATED                  : December 2, 2008
INVENTOR(S)        : Paolo Casati, Amedeo Maierna and Bruno Murari It is certified that error appears in the above-identified patent and that said Letters Patent is hereby corrected as shown below:

Column 6 Line 54 Claim 2 insert --angle-- between inner and ; (semi-colon)

Signed and Sealed this

Twentieth Day of January, 2009

JON W. DUDAS
*Director of the United States Patent and Trademark Office*